US009640576B2

United States Patent
Wu et al.

(10) Patent No.: US 9,640,576 B2
(45) Date of Patent: May 2, 2017

(54) IMAGE SENSING DEVICE AND METHOD FOR FABRICATING THE SAME

(71) Applicant: VisEra Technologies Company Limited, Hsin-Chu (TW)

(72) Inventors: Han-Lin Wu, Hsin-Chu (TW); Chieh-Yuan Cheng, Hsin-Chu (TW); Yu-Kun Hsiao, Hsin-Chu (TW); Huang-Jen Chen, Keelung (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/463,938

(22) Filed: Aug. 20, 2014

(65) Prior Publication Data
US 2016/0056193 A1    Feb. 25, 2016

(51) Int. Cl.
 *H01L 27/146* (2006.01)
(52) U.S. Cl.
 CPC .. *H01L 27/14621* (2013.01); *H01L 27/14627* (2013.01); *H01L 27/14685* (2013.01); *H01L 27/14645* (2013.01); *H01L 27/14689* (2013.01)
(58) Field of Classification Search
 CPC ............. H01L 27/14627; H01L 27/14685
 See application file for complete search history.

(56) References Cited

U.S. PATENT DOCUMENTS

| 4,920,075 A * | 4/1990 | Morita ........................... 438/694 |
| 2004/0033640 A1 * | 2/2004 | Izumi et al. .................... 438/59 |
| 2009/0230394 A1 * | 9/2009 | Nagaraja et al. ............... 257/59 |
| 2011/0279727 A1 * | 11/2011 | Kusaka .......................... 348/340 |
| 2012/0044395 A1 * | 2/2012 | Del Monte .................... 348/273 |

(Continued)

FOREIGN PATENT DOCUMENTS

| JP | 07-038075 A | 2/1995 |
| JP | 09-116127 A | 5/1997 |

(Continued)

OTHER PUBLICATIONS

Japanese Office Action dated May 9, 2016, as issued in corresponding Japan Office Action No. 2015-005590 (with English abstract 8 pages).

(Continued)

*Primary Examiner* — Matthew Landau
*Assistant Examiner* — Grant Withers
(74) *Attorney, Agent, or Firm* — Muncy, Geissler, Olds & Lowe, P.C.

(57) ABSTRACT

An image sensing device includes: an active layer with a plurality of photo-sensing elements; a color pattern disposed over one of the photo-sensing elements, wherein the color pattern has a color selected from the group consisting of red (R), green (G), and blue (B); a microlens disposed on the color pattern; and a transmissive pattern being adjacent to the color pattern and over another one of the photo-sensing elements, wherein the transmissive pattern includes a color filter portion and a microlens portion, and an absolute value of a difference of refractive indexes between the microlens and the color pattern is less than 0.3, and there is no difference of refractive indexes between the microlens portion and the color filter portion of the transmissive pattern.

21 Claims, 9 Drawing Sheets

(56) References Cited

U.S. PATENT DOCUMENTS

| | | | |
|---|---|---|---|
| 2012/0075509 A1* | 3/2012 | Ito | H01L 27/14621 |
| | | | 348/265 |
| 2013/0015545 A1* | 1/2013 | Toumiya | H01L 27/14605 |
| | | | 257/432 |
| 2013/0134537 A1* | 5/2013 | Nakajiki | H01L 27/14627 |
| | | | 257/432 |
| 2013/0264671 A1* | 10/2013 | Yun | H01L 27/14621 |
| | | | 257/432 |
| 2014/0218572 A1* | 8/2014 | Ootsuka | H01L 27/14621 |
| | | | 348/280 |
| 2015/0109501 A1* | 4/2015 | Sekine | 348/294 |

FOREIGN PATENT DOCUMENTS

| | | |
|---|---|---|
| JP | 2006-196634 A | 7/2006 |
| JP | 2013115335 A | 6/2013 |

OTHER PUBLICATIONS

Japanese Office Action from the corresonding JP 2015-005590 dated Feb. 6, 2017; 14 pgs.

* cited by examiner

IMAGE SENSING DEVICE AND METHOD FOR FABRICATING THE SAME

BACKGROUND OF THE INVENTION

Field of the Invention

The present invention relates to image sensing devices, and more particularly to an image sensing device having reduced reflective index (n) variations between the color filters and the microlenses therein.

Description of the Related Art

Image sensing devices are necessary components in many optoelectronic devices, including digital cameras, cellular phones, and toys. Conventional sensing devices include both charge coupled device (CCD) image sensors and complementary metal oxide semiconductor (CMOS) image sensors.

An image sensor typically includes a plane array of pixel cells, wherein each pixel cell comprises a photogate, photoconductor or a photodiode having a doped region for accumulating a photo-generated charge. A periodic pattern of dyes or pigment of different colors such as red (R), green (G), or blue (B) is superimposed over the plane array of pixel cells. This pattern is known as a color filter array (CFA). A plurality of microlenses of a square or a circular shape can be optionally superimposed over the color filter array (CFA) to focus light onto one initial charge accumulation region of each of the pixel cells. Using the microlenses may significantly improve the photosensitivity of the image sensor.

However, due to the refractive index (n) variations between materials of the color filters of different colors such as R, G, or B, and materials of the microlenses formed thereover, undesired refraction can happen when incident light arrives at an interface between the microlenses and the color filters. Therefore, energy of the incident light passing through the microlenses and color filters is reduced and sensitivity of the pixel cells of the image sensing device is thus reduced.

BRIEF SUMMARY OF THE INVENTION

Accordingly, image sensing devices and methods for fabricating the same are provided to eliminate or reduce the issue of energy reduction of the incident light due to the refractive index variations between materials of the color filters and the microlens in the image sensing devices.

An exemplary image sensing device comprises: an active layer with a plurality of photo-sensing elements; a color pattern disposed over one of the photo-sensing elements, wherein the color pattern has a color selected from the group consisting of red (R), green (G), and blue (B); a microlens disposed on the color pattern; and a transmissive pattern being adjacent to the color pattern and over another one of the photo-sensing elements, wherein the transmissive pattern comprises a color filter portion and a microlens portion formed over the color filter portion, and an absolute value of a difference of refractive indexes between the microlens and the color pattern is less than 0.3, and there is no difference of refractive indexes between the microlens portion and the color filter portion of the transmissive pattern An exemplary method for fabricating an image sensing device comprises: providing an image sensing structure comprising an active layer with a plurality of photo-sensing elements and a color pattern, wherein the color pattern covers one of the photo-sensing elements and has a color selected from the group consisting of red (R), green (G), and blue (B); forming a transmissive pattern being adjacent to the color pattern and over another one of the photo-sensing elements, wherein the transmissive pattern comprises a color filter portion and a microlens portion formed over the color filter portion; and forming a microlens on the color pattern wherein an absolute value of a difference of refractive indexes between the microlens and the color pattern is less than 0.3, and there is no difference of refractive indexes between the microlens portion and the color filter portion of the transmissive pattern.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-8 are schematic cross sections showing an exemplary method for fabricating an image sensing device.

Figure 1:
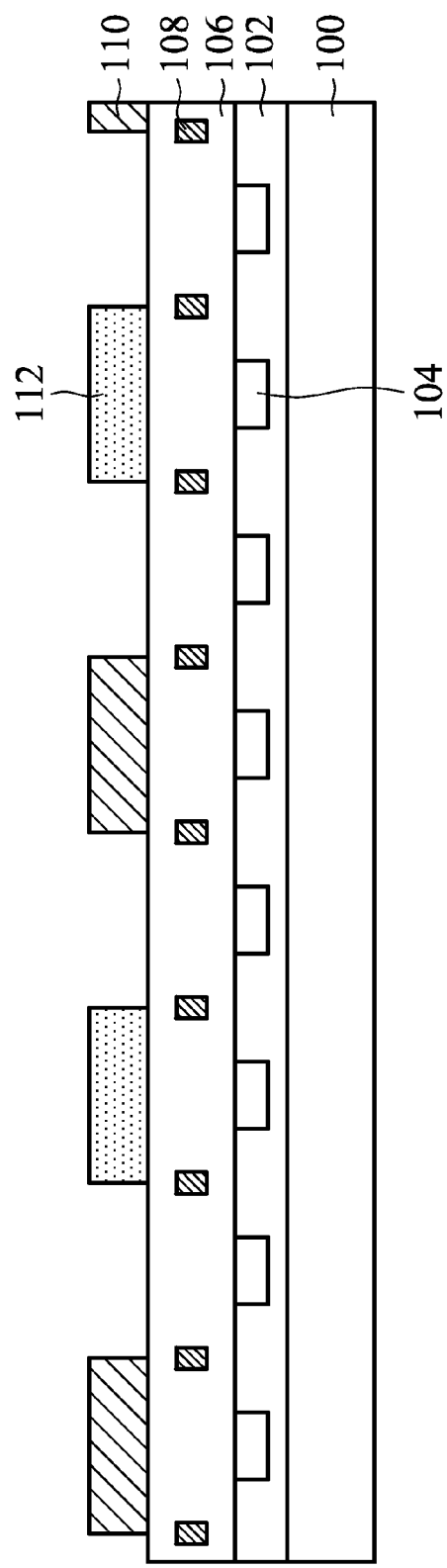
FIGS. 1-8 are schematic cross sections of a method for fabricating an image sensing device according to an embodiment of the invention.

In FIG. 1, a substantially fabricated image sensing structure is first provided, including a semiconductor substrate 100, an active layer 102 with a plurality of photo-sensing elements 104 formed therein, a passivation layer 106 with a plurality of light shielding metals 108 formed therein over the active layer 102, and a plurality of color patterns 110 and 112 formed over the passivation layer 106. The photo-sensing elements 104 can be, for example, photodiodes or CMOS sensing elements, and are separately formed in the active layer 102. The light shielding metals 108 in the passivation layer 106 are formed over the active layer 102 at a place not covering the photo-sensing elements 104 therein to define light-shielding areas for shielding the area of the pixel except for the area of the photo-sensing elements 104 and define opening areas exposing the area of the photo-sensing elements 104. The color patterns 110 and 112 formed over the passivation layer 106 are alternatively and separately formed over one of the photo-sensing elements 104 thereunder, and space is left between two adjacent color patterns 110 and 112. Therefore, the photo-sensing elements 104 under the space between the two adjacent color patterns 110 and 112 are not covered by the color patterns 110 or 112. In one embodiment, the color patterns 110 and 112 may comprise photosensitive type color resists of dyes or pigments of different colors selected from the group consisting of red (R), green (G), and blue (B), and may be formed by, for example, spin coating and a photolithography process, respectively. In one embodiment, the color patterns 110 and 112 may have a refractive index (n) of, for example, about 1.7-1.9 as a red color filter, a refractive index (n) of, for example, about 1.5-1.7 as a blue color filter, and a refractive index (n) of, for example, about 1.5-1.7 as a green color filter. The following tables 1-3 show exemplary materials for forming the patterns 110 and 112 with red (R), green (G), and blue (B) colors, respectively.

TABLE 1 materials of green (G) color patterns

| Chemicals | Contents |
| --- | --- |
| 1-Methoxy-2-propanol acetate, PEGMA | 60-80% |
| Cyclohexanone | 1-10% |
| Acrylic resin | 1-10% |
| Multi functional acrylic monomer | 1-10% |
| Green pigment | 1-10% |
| Yellow pigment | 1-10% |
| Oxime derivative | 1-5% |

TABLE 2 materials of red (R) color patterns

| Chemicals | Contents |
| --- | --- |
| 1-Methoxy-2-propanol acetate, PEGMA | 65-85% |
| Acrylic resin | 1-10% |
| Ethyl-3-ethoxypropionate | 1-10% |
| Multi functional acrylic monomer | 1-10% |
| Red pigment | 1-10% |
| Yellow pigment | 1-10% |
| Cyclohexanone | 1-10% |
| Additive | 0.1-5% |

TABLE 3 materials of blue (B) color patterns

| Chemicals | Contents |
| --- | --- |
| 1-Methoxy-2-propanol acetate, PEGMA | 60-80% |
| Cyclohexanone | 1-10% |
| Acrylic resin | 1-10% |
| Multi functional acrylic monomer | 1-10% |
| Oxime derivative | 1-5% |
| violet pigment | 0.1-5% |
| Ethylbenzene | 0.1-1% |
| Xylene | 0.1-1% |

Figure 2:
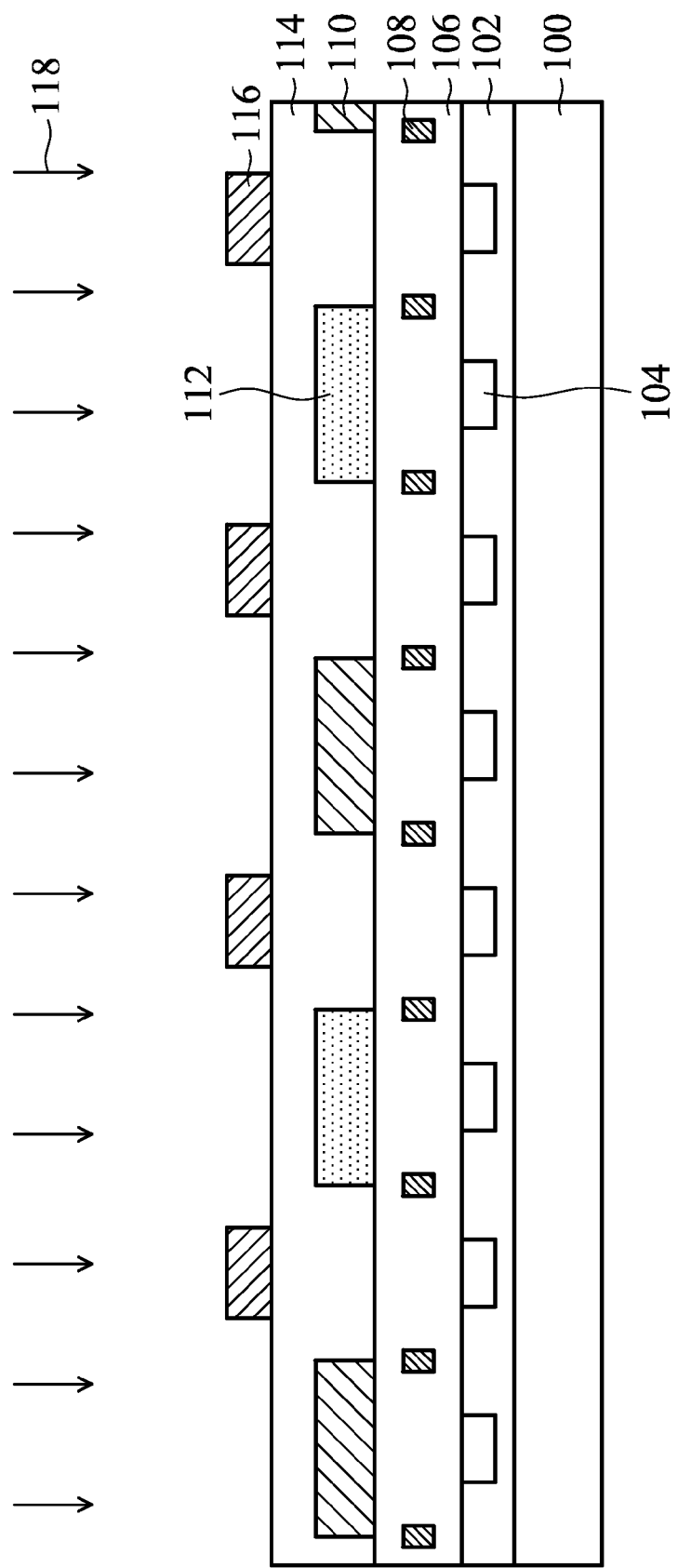

In FIG. 2, a transmissive layer 114 is then blanketly formed over the passivation layer 106 by a deposition process, such as a spin coating process, covering the color patterns 110 and 112, and the space between the adjacent color patterns 110 and 112. The transmissive layer 114 may comprise highly light-transmitting materials but no dye or pigment with predetermined colors therein, and have a refractive index (n) of, for example, about 1.75-1.95. The transmissive layer 114 may comprise photosensitive-type resists, and may be formed by, for example, spin coating. The following table 4 shows exemplary materials for forming the transmissive layer 114.

TABLE 4 materials of the transmissive layer 114

| Chemicals | Contents |
| --- | --- |
| Propylene glycol monomethylether acetate | 95-45% |
| 1,4-Dioxane | <1% |
| Acrylic type resin | 40-5% |
| Photoactive compound | 15-1% |

Still referring to FIG. 2, a plurality of hard mask patterns 116 are then separately formed over the transmissive layer 114, covering a portion of the transmissive layer over the space between the color patterns 110 and 112, respectively. The hard mask patterns 116 may comprise photosensitive materials and can be formed by a photolithography process (not shown), thereby forming the plurality of hard mask patterns 116 over the transmissive layer 114. The hard mask patterns 116 are formed with rectangular shapes. Next, a thermal process 118 such as a hot plate thermal reflow process is performed to deform a shape of the hard mask patterns 116.

Figure 3:
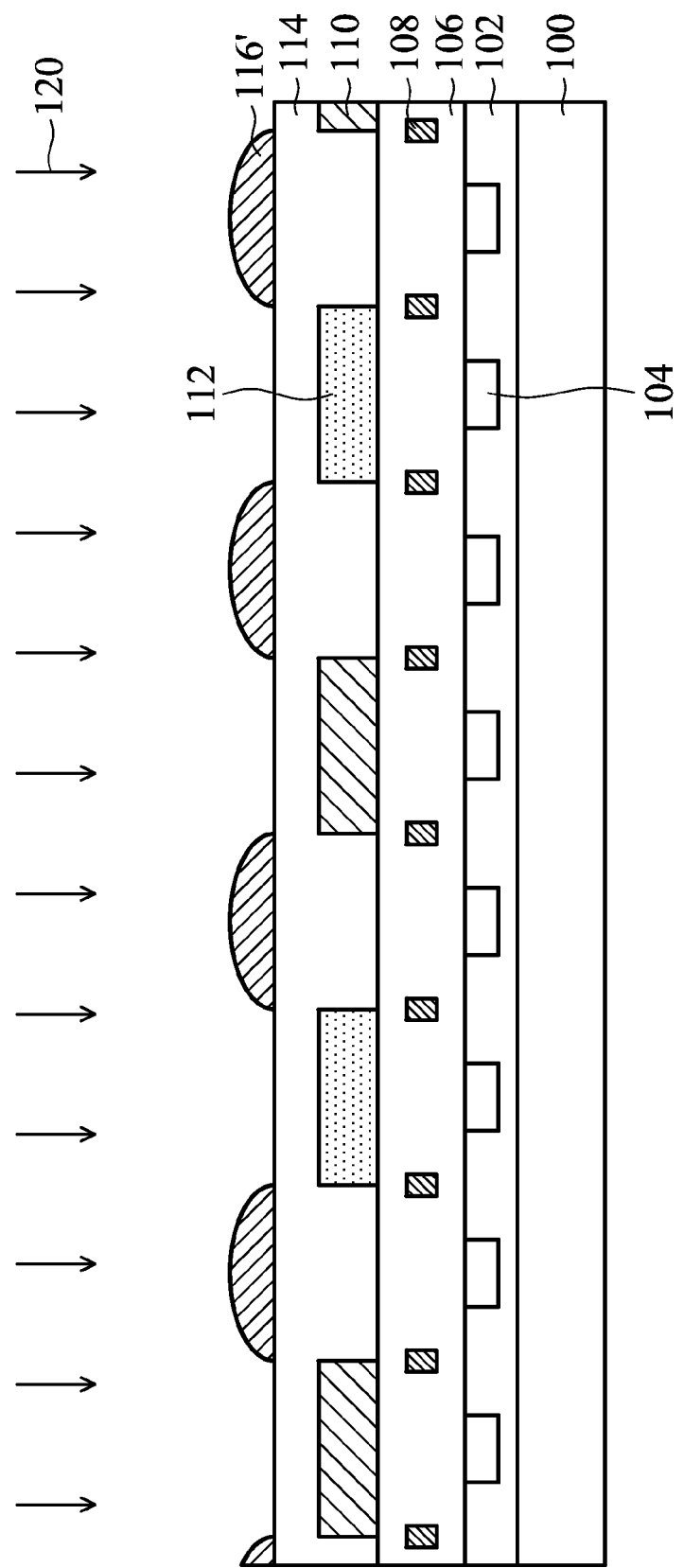

In FIG. 3, after the thermal process 118, a plurality of hard mask patterns 116' with round shape are thus formed, covering the portion of the transmissive layer 114 over the space between the color patterns 110 and 112, respectively. In one embodiment, the round shape of the hard mask patterns 116' can be round or nearly round, and is of, pertaining to, or used for making something turning, curving, or circling around. As shown in FIG. 3, the round shape of the hard mask patterns 116' can be a semicircular shape, but is not limited thereto. An etching process 120 such as a dry etching process is performed to the transmittance layer 114, using the hard mask patterns 116' as an etching mask.

Figure 4:
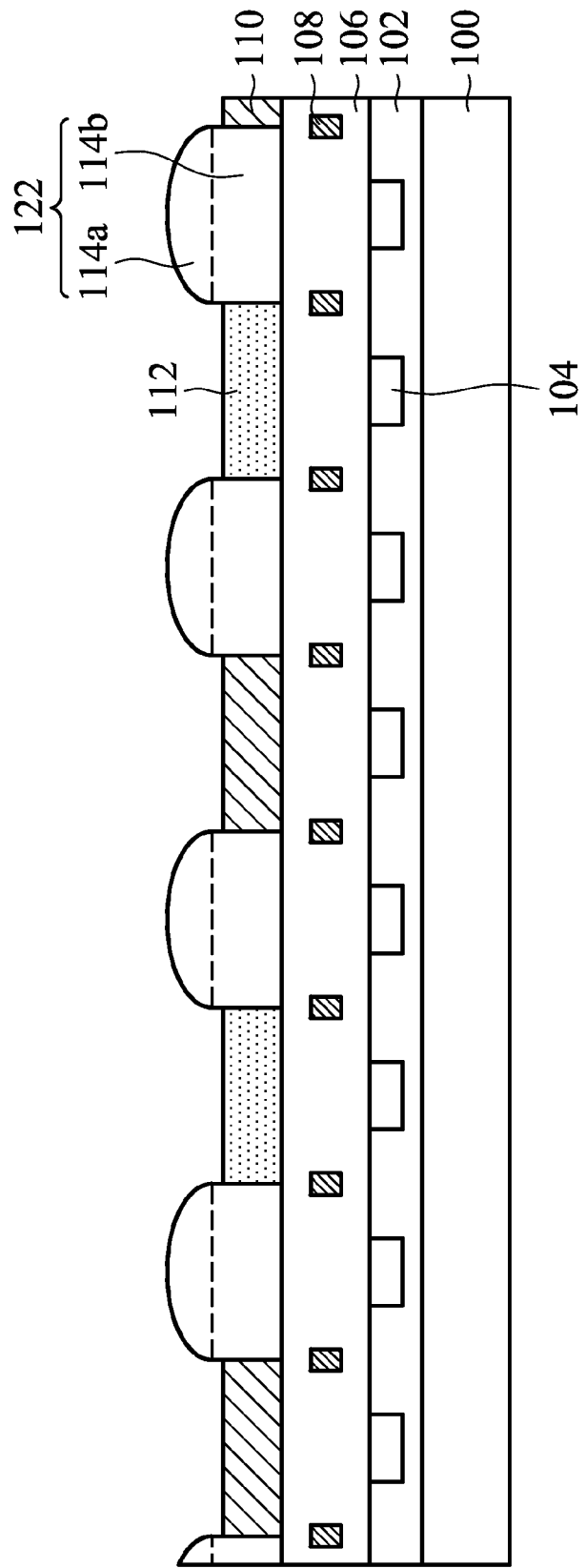

In FIG. 4, after the patterning process 120, a plurality of transmissive patterns 122 are separately formed over the passivation layer 106. The transmissive patterns 122 are respectively formed over one of the photo-sensing elements 104 between the adjacent color patterns 110 and 112, having a lower portion 114b with a rectangular cross section for functioning as a color filter and an upper portion 114a formed over the lower portion 114b with a round shape cross section for functioning as a microlens, respectively. The transmissive patterns 122 and the photo-sensing elements 104 thereunder form clear or white pixels of an image sensing device. These clear or white pixels may have spectroscopic properties correlative with brightness and may detect the luminance information of a subject. In addition, due to the upper portion 114a and the lower portion 114b of the transmissive patterns 122 are formed with the same materials, such that there is no difference of refractive indexes between the upper portion 114a and the lower portion 114b of the transmissive patterns 122. Therefore, the issue of energy reduction of the incident light due to the refractive index variations between materials of the color filters and the microlenses in these clear or white pixels of the image sensing devices can be eliminated.

Figure 5:
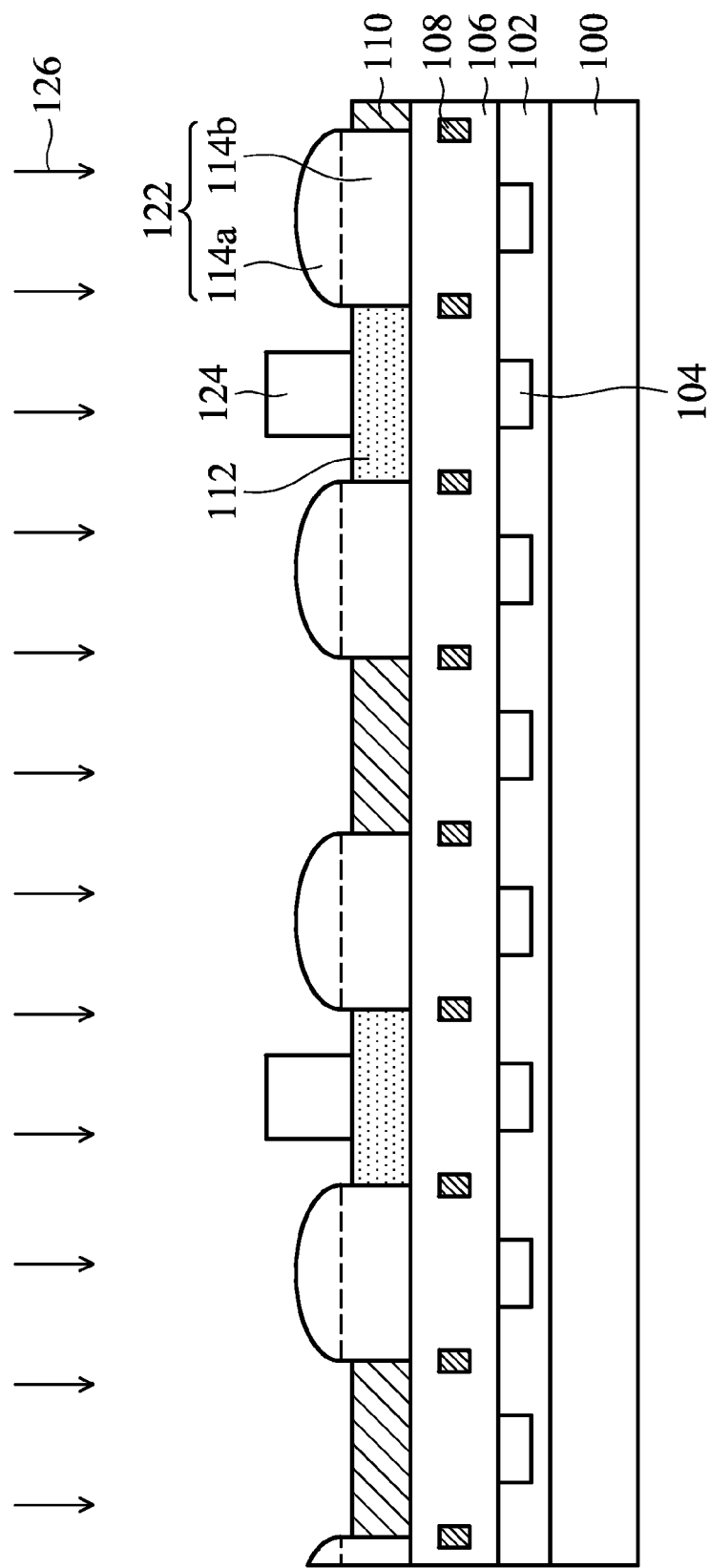

In FIG. 5, a plurality of microlens patterns 124 is separately formed over a portion of one of the color patterns 112 to contact thereof. The microlens patterns 124 may comprise photosensitive materials such as reflowable type photosensitive materials, and are formed by a photolithography process (not shown), thereby forming the plurality of rectangular microlens patterns 124 over a portion of one of the color patterns 112, respectively. The microlens patterns 124 are formed with rectangular shapes and may have a refractive index (n) greater or less than that of the color patterns 112, and an absolute value of a difference the refractive indexes between the microlens patterns 124 and the underlying color patterns 112 can be less than, for example, 0.3. Next, a thermal process 126 such as a hot plate thermal reflow process is performed to deform the shape of the microlens patterns 124.

Figure 6:
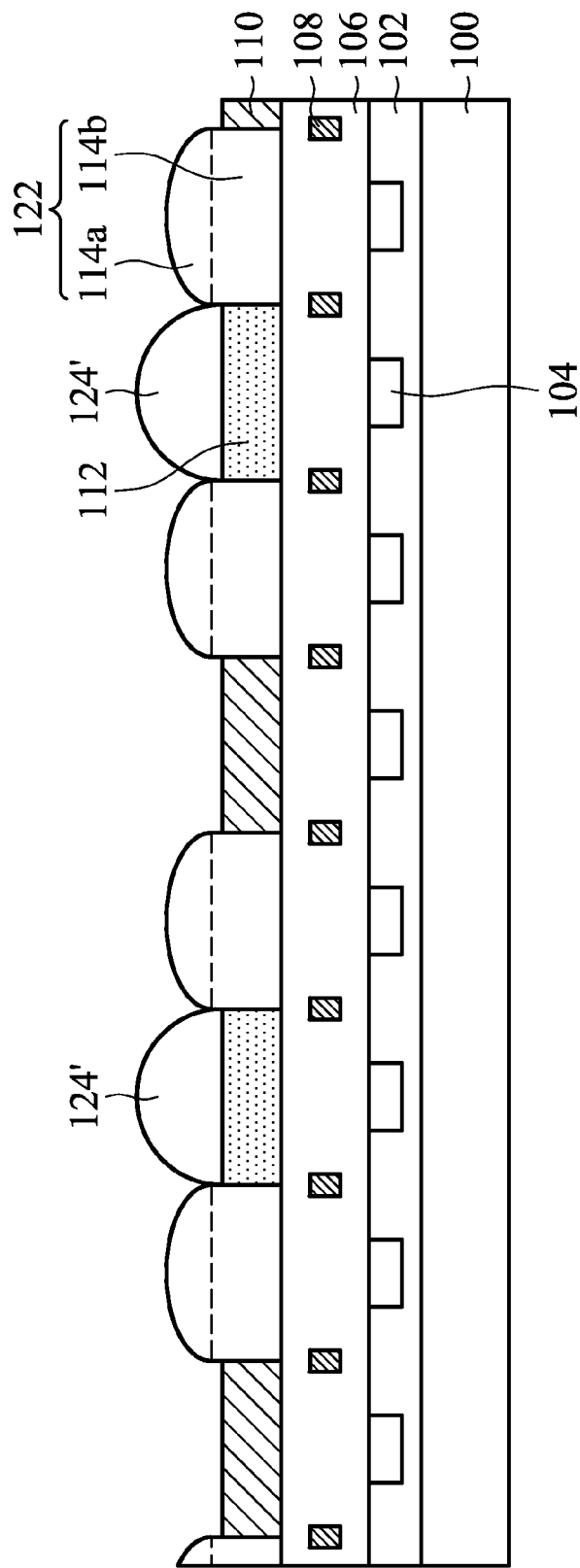

In FIG. 6, after the thermal process 126, a plurality of microlens patterns 124' with round shape are thus formed over the color patterns, respectively. In one embodiment, the round shape of the microlens patterns 124' can be round or nearly round, and is of, pertaining to, or used for making something turning, curving, or circling around. In another embodiment, the round shape of the microlens patterns 124' can be a semicircular shape, but is not limited thereto. Each of the microlens patterns 124' may be formed between the transmissive patterns 122 and cover one of the photo-sensing elements 104 under the color patterns 112. Due to the variations of the refractive indexes between the microlens patterns 124' and the underlying color patterns 112 being reduced to less than 0.3, such that undesired refraction of incident light (not shown) at an interface between the microlens patterns 124' and the underlying color patterns 112 can be reduced, and energy lost from the incident light can be reduced or eliminated, and sensitivity of the pixels comprising the microlens patterns 124' and color patterns 112 can be thus improved.

Figure 7:
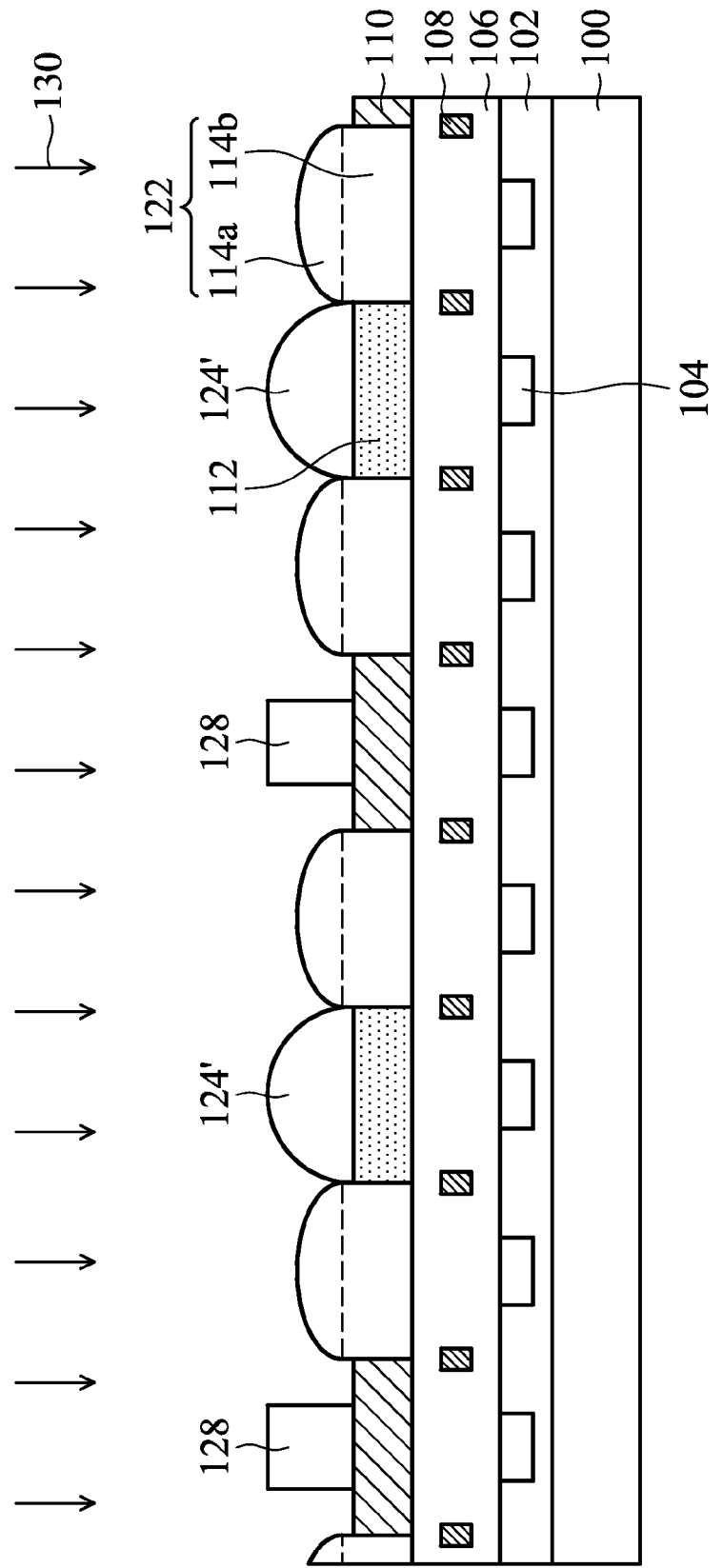

In FIG. 7, a plurality of microlens patterns 128 is separately formed over a portion of one of the color patterns 110 to contact thereof. The microlens patterns 128 may comprise photosensitive materials such as reflowable type photosensitive materials, and are formed by a photolithography process (not shown), thereby forming the plurality of rectangular microlens patterns 128 over a portion of one of the color patterns 110, respectively. The microlens patterns 128 are formed with rectangular shapes and may have a refractive index (n) greater or less than that of the color patterns 128, and an absolute value of a difference the refractive indexes between the microlens patterns 128 and the underlying color patterns 110 can be less than, for example, 0.3. Next, a thermal process 130 such as a hot plate thermal reflow process is performed to deform the shape of the microlens patterns 128.

Figure 8:
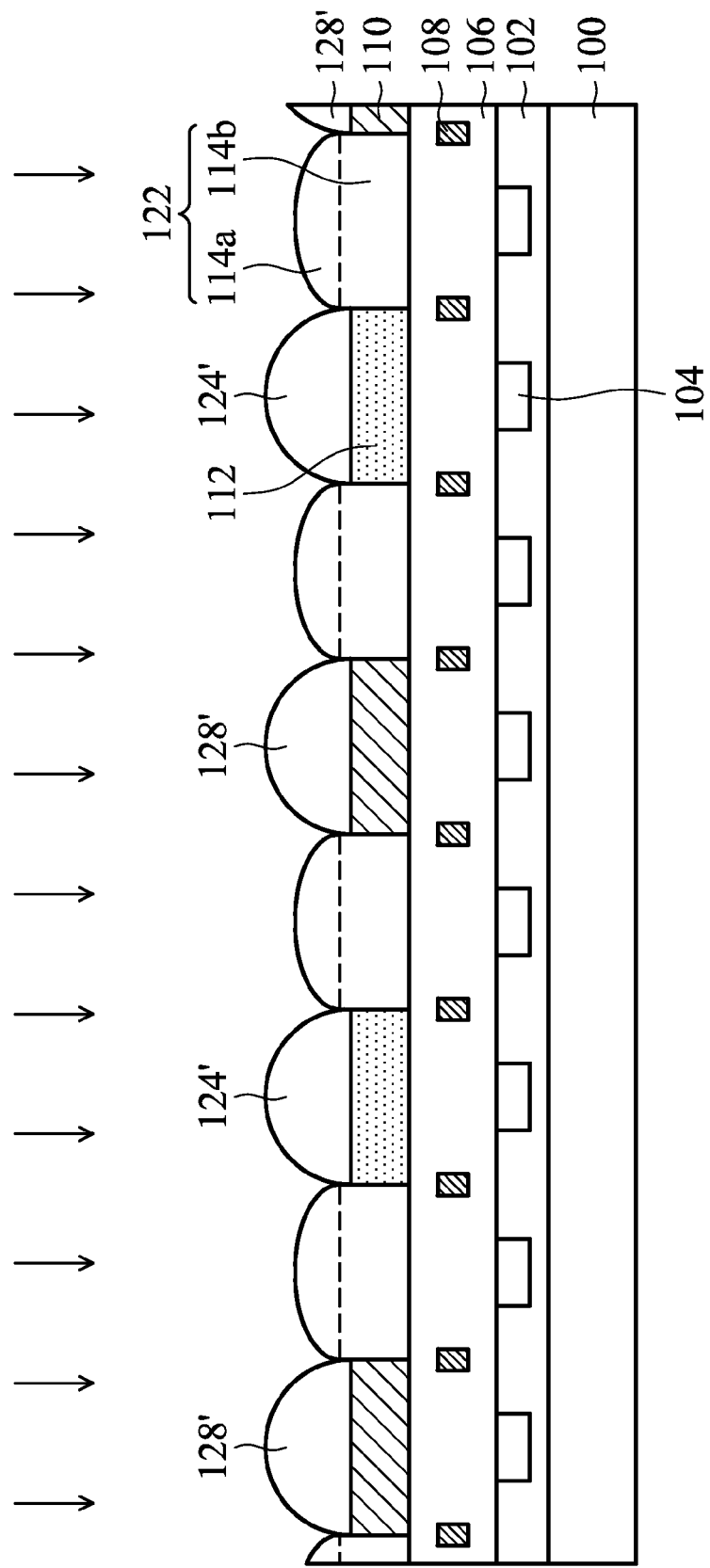

In FIG. 8, after the thermal process 130, a plurality of microlens patterns 128' with round shape are thus formed over the color patterns, respectively. In one embodiment, the round shape of the microlens patterns 128' can be round or nearly round, and is of, pertaining to, or used for making something turning, curving, or circling around. In another embodiment, the round shape of the microlens patterns 128' can be a semicircular shape, but is not limited thereto. Each of the microlens patterns 128' may be formed between the transmissive patterns 122 and cover one of the photo-sensing elements 104 under the color patterns 110. Due to the variations of the refractive indexes between the microlens patterns 128' and the underlying color patterns 110 being reduced to less than 0.3, such that undesired refraction of incident light (not shown) at an interface between the microlens patterns 128' and the underlying color patterns 110 can be reduced, energy lost from the incident light can be reduced or eliminated and sensitivity of the pixels comprising the microlens patterns 128' and color patterns 110 can be thus improved. Heights of the microlens patterns 128' and the microlens patterns 124' can be the same or different depending on optical designs of pixels in the image sensing device shown in FIG. 8.

Figure 9:
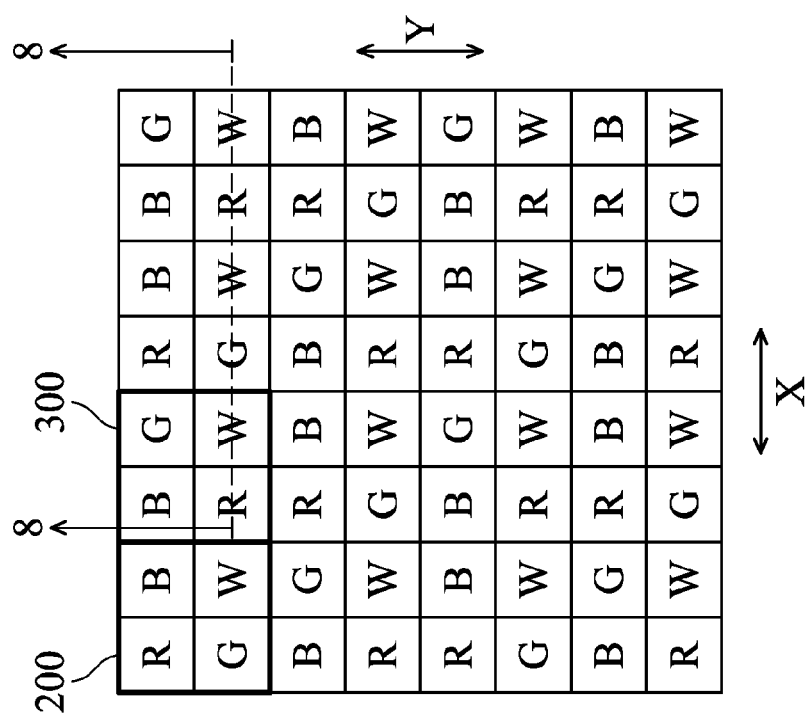
FIG. 9 is a schematic top view showing a color filter array for an image sensing device according to an embodiment of the invention.

FIG. 9 is a schematic top view showing an exemplary color filter array for the image sensing device as shown in FIG. 8.

As shown in FIG. 9, the color filter array may comprise a plurality of unit patterns 200 and 300 which alternatively arranged and disposed along both X and Y directions. In one embodiment, the unit patterns 200 and 300 are shown as a 2×2 color filter array and comprise color filters of red (R), blue (B), green (G), and clear/white (W) with different arrangements therein. FIG. 8 shows a cross section of an image sensing device having a color filter arrangement taken the along line 8-8 in FIG. 9. However, the image sensing device of the invention may have an arrangement of the color filters other than that shown in FIGS. 8-9, and are not limited to that shown in FIGS. 8-9.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensing device, comprising:
   an active layer with a plurality of photo-sensing elements;
   a color pattern disposed over one of the photo-sensing elements, wherein the color pattern has a color selected from the group consisting of red (R), green (G), and blue (B);
   a microlens disposed on the color pattern;
   a transmissive material including a surface; and
   a transmissive pattern, included within the transmissive material, being adjacent to the color pattern and over another one of the photo-sensing elements, wherein the transmissive pattern comprises a color filter portion and a microlens portion, and an absolute value of a difference of refractive indexes between the microlens and the color pattern is less than 0.3, and there is no difference of refractive indexes between the microlens portion and the color filter portion of the transmissive pattern, wherein the color pattern is formed between a bottom surface of the microlens and the active layer, and the color filter portion of the transmissive pattern is formed between a bottom surface of the microlens portion of the transmissive pattern and the active layer;
   wherein
   there is a height difference between top surfaces of the microlens and the transmissive material.

2. The image sensing device as claimed in claim 1, wherein the color pattern has a red color and a refractive index of about 1.7-1.9.

3. The image sensing device as claimed in claim 1, wherein the color pattern has a blue color and a refractive index of about 1.5-1.7.

4. The image sensing device as claimed in claim 1, wherein the color pattern has a green color and a refractive index of about 1.6-1.7.

5. The image sensing device as claimed in claim 1, wherein the transmissive pattern has a refractive index of about 1.75-1.95.

6. The image sensing device as claimed in claim 1, wherein the microlens has a round shape.

7. The image sensing device as claimed in claim 1, wherein the microlens portion of the transmissive pattern has a round shape.

8. The image sensing device as claimed in claim 1, wherein the transmissive pattern and the photo-sensing element thereunder form a clear or white pixel.

9. The image sensing device as claimed in claim 1, wherein the photo-sensing elements comprise CMOS image sensing elements or photodiodes.

10. The image sensing device as claimed in claim 1, further comprising:
    a second color pattern disposed over one of the photo-sensing elements different from the ones under the color pattern and the transmissive pattern, wherein the second color pattern has a color selected from the group consisting of red (R), green (G), and blue (B); and a second microlens disposed on the second color pattern; wherein the microlens and the second microlens have a different height between top surfaces thereof.

11. A method for fabricating an image sensing device, comprising:

providing an image sensing structure comprising an active layer with a plurality of photo-sensing elements and a color pattern, wherein the color pattern is disposed over one of the photo-sensing elements and has a color selected from the group consisting of red (R), green (G), and blue (B);

forming a transmissive material having a top surface and including a transmissive pattern therein, the transmissive pattern being adjacent to the color pattern and over another one of the photo-sensing elements, wherein the transmissive pattern comprises a color filter portion and a microlens portion formed over the color filter portion; and forming a microlens on the color pattern, wherein an absolute value of a difference of refractive indexes between the microlens and the color pattern is less than 0.3, and there is no difference of refractive indexes between the microlens portion and the color filter portion of the transmissive pattern wherein the color pattern is formed between a bottom surface of the microlens and the active layer, and the color filter portion of the transmissive pattern is formed between a bottom surface of the microlens portion of the transmissive pattern and the active layer, and wherein there is a height difference between top surfaces of the microlens and the transmissive material.

12. The method as claimed in claim 11, wherein forming the transmissive pattern comprises:

forming a transmissive layer over the active layer;

forming a hard mask pattern over a portion of the transmissive layer and one of the photo-sensing elements thereunder; and performing an etching process to the transmittance layer by using the hard mask pattern as an etching mask and forming the transmissive pattern.

13. The method as claimed in claim 11, wherein forming the microlens pattern comprising:

forming a microlens pattern over a portion of the color pattern; and performing a thermal process and deforming the microlens pattern into the microlens over the color pattern.

14. The method as claimed in claim 11, wherein the color pattern has a red color and a refractive index of about 1.7-1.9.

15. The method as claimed in claim 11, wherein the color pattern has a blue color and a refractive index of about 1.5-1.7.

16. The method as claimed in claim 11, wherein the color pattern has a green color and a refractive index of about 1.6-1.7.

17. The method as claimed in claim 11, wherein the transmissive pattern has a refractive index of about 1.75-1.95.

18. The method as claimed in claim 11, wherein the microlens has a round shape.

19. The method as claimed in claim 11, wherein the microlens portion of the transmissive pattern has a round shape.

20. The method as claimed in claim 11, wherein the transmissive pattern and the photo-sensing element thereunder form a clear or white pixel.

21. The method as claimed in claim 11, wherein the photo-sensing elements comprise CMOS image sensing elements or photodiodes.

* * * * *